Dec. 2, 1958 J. R. WILLIAMS 2,862,470

TRANSISTOR MOLD ASSEMBLIES

Filed Nov. 19, 1953 2 Sheets-Sheet 1

INVENTOR
JOHN R. WILLIAMS
BY
Elmer J. Gorn
ATTORNEY

TRANSISTOR MOLD ASSEMBLIES

Filed Nov. 19, 1953 2 Sheets-Sheet 2

INVENTOR
JOHN R. WILLIAMS
BY
Elmer J. Gorn
ATTORNEY 2,862,470
Patented Dec. 2, 1958

2,862,470

TRANSISTOR MOLD ASSEMBLIES

John R. Williams, Natick, Mass., assignor to Raytheon Manufacturing Company, Waltham, Mass., a corporation of Delaware Application November 19, 1953, Serial No. 393,200

4 Claims. (Cl. 113—99)

This invention relates to a mold assembly used to make diffused junction type transistors and more particularly to the structure of the mold assembly as utilized to fuse simultaneously an emitter material, a collector material and a base tab to a crystal chip of semiconductor material.

In the production of diffused junction transistors it is desirable to combine as many of the steps of the process in one operation as is possible. For example, the emitter material, the collector material and the base tab of a transistor assembly are usually connected to the semiconductor crystal chip in separate steps, each of which is time consuming, subject to human error and expensive. The inherent savings made by combining these steps in one operation can be obtained by using the mold assembly described below.

This invention involves the use of a mold assembly adapted to hold and pre-position the transistor components so that they can be simultaneously joined to form a basic transistor assembly. It should be noted that one of the primary problems of such a simultaneous fusing process involves properly aligning the base tab and the collector material so that they will make good contact with the crystal chip while being fused thereon. Therefore, the mold assembly has been designed to solve this problem and comprises two parts, one of which is a tray, wherein a plurality of counter-sunk rectangular recesses have been drilled to hold the transistor components in proper alignment. The other part of the mold assembly is comprised of a plurality of substantially rectangular shaped washers. One of each of these washers is adapted to fit into a recess in the tray to prevent the components from moving during the fusing process.

Thus, each of the recesses in the tray is designed to hold a collector material, a semiconductor crystal chip and a base tab. The tray, which can be made of graphite, for example, has at the bottom of each of the recesses therein a small cavity adapted to hold the collector material, such as a small cylinder of indium, a p-type electrically-conductive element. Directly above the collector cavity and adjacent thereto is a rectangular chamber designed to support a member of semiconductor material, such as a rectangular chip of single crystal germanium having an electrical conductivity of the n-type. Slightly above this chamber and leading away therefrom is a channel having a step-like floor constructed to support a pre-tinned base tab, such as a rectangular strip of nickel, in such a way that one end of the base tab will rest on an end section of the semiconductor chip, and the opposite end of the tab will rest on the upper step of the channel during the fusing process.

It should also be noted that on opposed sides of the base tab channel two semi-cylindrical slots leading to the top face of the tray are provided to facilitate removing the transistor assembly after the fusing process has been completed. A pair of tweezers can be used for this purpose, thereby protecting the components from the dangers of excessive handling.

The second part of the mold assembly, as previously mentioned, is the washer. A plurality of these washers are used to hold the transistor components in place after a set of transistor components have been pre-positioned within the recesses of the tray. Thus, the washers prevent vibrations from destroying the critical alignment of these components. It should be noted that the washers are also rectangular in form to match the recesses in the tray so that each washer has only one degree of freedom in a vertical upward direction. The washers are also provided with a small tapered hole extending therethrough so that when a washer is properly positioned, the bottom end of the hole is adjacent to the upper face of the crystal chip and directly opposed to the collector material.

The emitter material, such as a small bead or cylinder of indium, is then placed in the upper opening of the aforementioned hole. Therefore, prior to heating the mold assembly, the transistor components have been aligned with respect to their relative positions about the semiconductor crystal chip, so that the lower face of each chip is adjacent to and slightly separated from the collector material, the upper face of the chip is positioned next to the emitter material, and an end of the base tab rests securely on an end section of the chip.

By placing the mold assembly in an oven heated to a temperature above the melting point of the collector and emitter materials and the solder on the base tab, but below that of the semiconductor crystal chips, a plurality of basic transistor assemblies can be formed in a single operation. The collector material will melt, expand, and tend to assume a spherical shape so that in the melted form the collector material touches and wets the lower face of the crystal chip and begins to diffuse into the chip as the heating process progresses. Likewise, the emitter material will melt, be deposited on the upper surface of the chip, and will slowly diffuse into the chip during the heating process. Simultaneously, the base tab, which has been pre-timed with a solder having a melting point below the temperature at which the oven is heated, will be joined to the end section of the chip. The heating process is discontinued after a predetermined period of time during which a diffused junction is formed. The mold assembly is then cooled and the washers are removed. The basic transistor assemblies are then removed, as mentioned above, by placing a pair of tweezers into the semi-cylindrical slots and grasping the sides of the base tab to lift the assembly.

In the particular example given above, the transistor assembly formed would be a p-n-p diffused junction type, but it should be noted that junction diodes and other types of diffused junction transistors can be formed as well. However, this invention and the features thereof will be understood more clearly and fully from the following detailed description of one embodiment of the invention with reference to the accompanying drawings wherein.

Figures 1, 2:
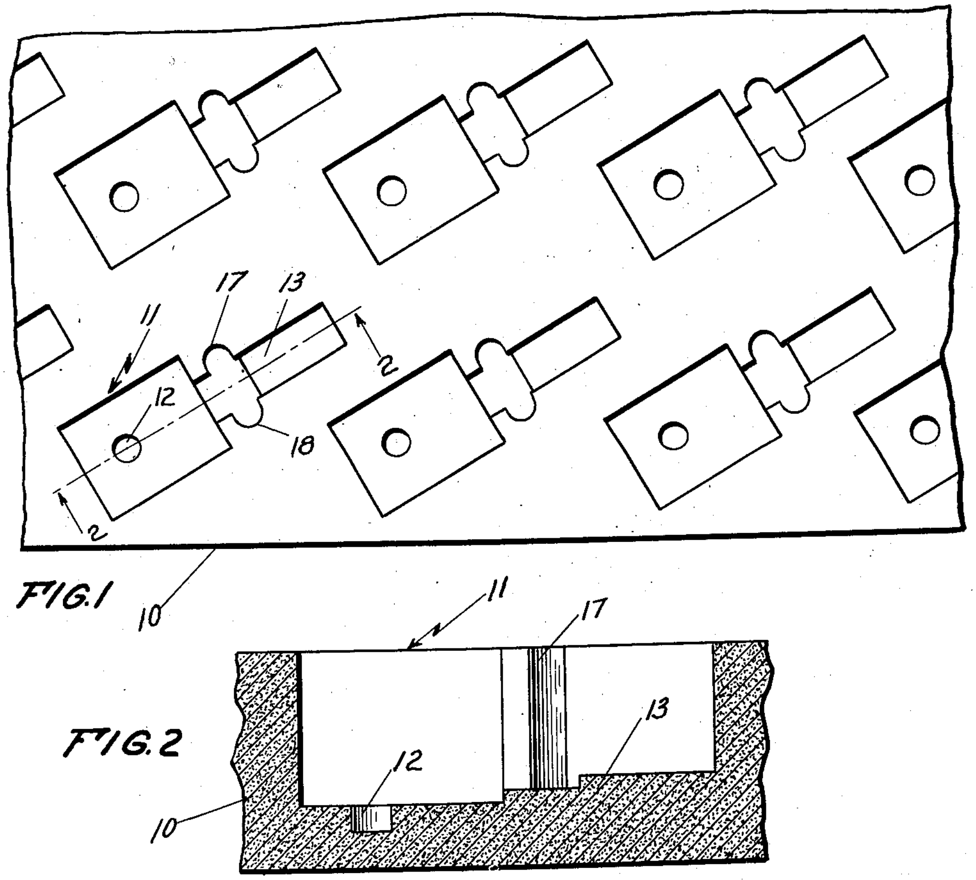
Fig. 1 is a partial top view of a tray made in accordance with this invention.
Fig. 2 is a partial cross-sectional view taken along line 2—2 in Fig. 1.
Figures 5, 6, 7:
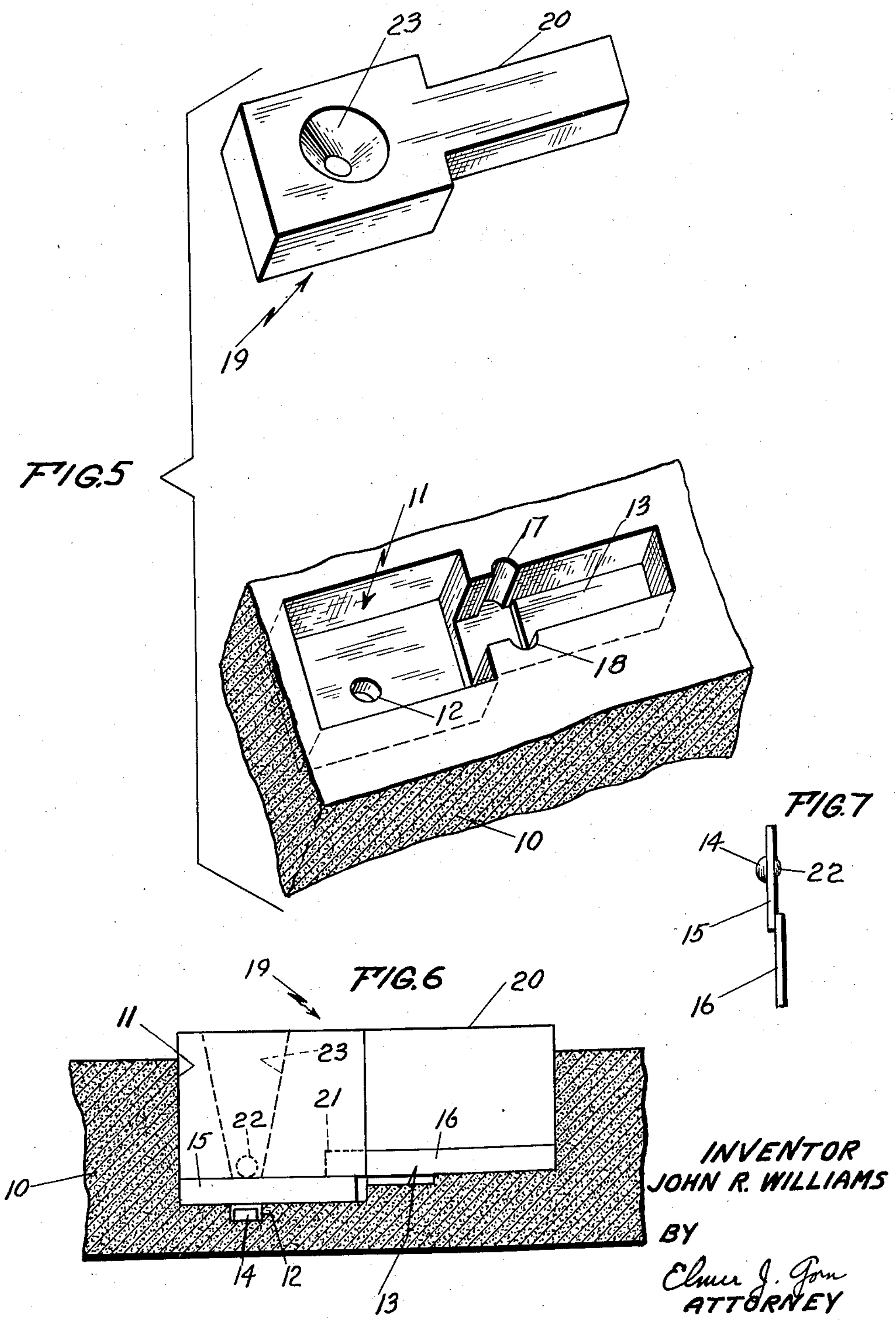
Fig. 5 is an exploded view of a mold assembly made in accordance with this invention.
Fig. 6 is an exploded schematic view of the mold assembly and the transistor components aligned therein.
Fig. 7 is a side view of finished transistor assembly.

Referring now to Figs. 1, 2 and 5, a tray 10 which comprises one of the two sections of the mold assembly, is shown. This tray consists of a plurality of rectangular-shaped recesses 11, six of which are illustrated in Fig. 1, drilled into a block of graphite, for example. The overall size of this tray is not limited and only depends upon the number of transistor assemblies desired to be formed in a single tray. For example, a tray six inches long having approximately fifty recesses drilled therein can be used successfully for the purposes of this invention, and the tray can be of the order of one and one-quarter inches wide and one-quarter inch thick.

As shown in Figs. 1, 2 and 5, the floor of each of the recesses 11 has a depression therein in the form of a small cylindrical cavity 12. Leading away from each of the rectangular recesses 11 and slightly raised above the level of the floor thereof is a step-like channel 13. Thus, it may be seen, with reference to Figs. 5 and 6, that a small cylinder of collector material 14, such as indium, for example, can be placed in each cavity 12 in the recessed sections 11 of the tray 10. Likewise, a chip 15 of single crystal semiconductor material, such as a chip of n-type germanium, for example, which has been formed in any of a number of ways well known in the art, can be supported on the floor of the recesses 11. Similarly, a base tab 16 can be aligned within the step-like channel 13 so that it slightly overlaps and rests on an end section of the chip 15, as shown in Fig. 6. The tab 16 can be a rectangular strip of nickel, for example, and should be pre-tinned with a suitable solder, such as a lead-tin solder, the melting point of which is substantially below the temperature of the oven wherein the above-mentioned transistor components are to be fused.

As previously mentioned, the channel 13 has been designed so that the tab 16 makes excellent contact with the end section of the chip 15. Thus, the base tab 16, when placed in this channel, as shown in Fig. 6, rests as a simply supported beam; that is, both ends of the tab are supported and the mid-section thereof is left without support. Due to the design of the channel, the two points of support for the tab are the upper step on the floor of the channel and the semiconductor chip 15. Since the chip should be substantially greater in thickness than is the height of the lower step, the lower step does not interfere with this means of support and good contact with the semiconductor chip is assured. Furthermore, this channel has been provided with two opposed vertical slots 17 and 18, as may be seen in Figs. 1, 2 and 5, which are semi-cylindrical in shape and adapted to receive a pair of tweezers, not shown, for the purpose of easily removing the transistor assembly after it has been properly fused.

Figure 3:
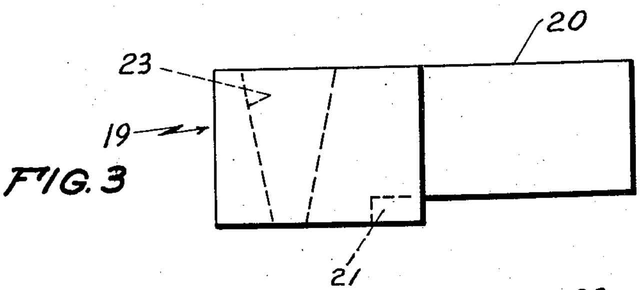
Fig. 3 is a side view of a washer made in accordance with this invention.
Figure 4:
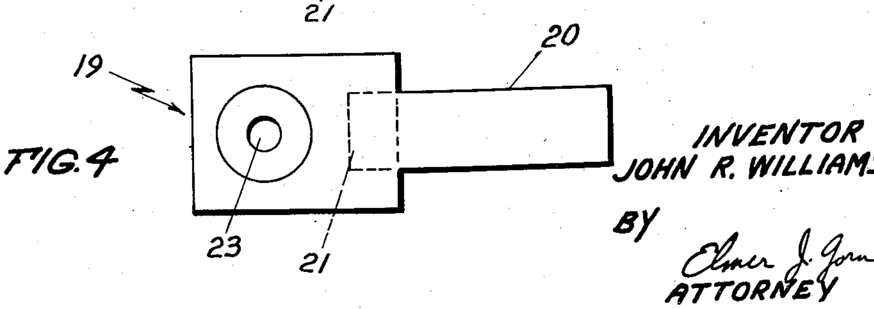
Fig. 4 is a top view of a washer.

Referring now to Figs. 3, 4 and 5, a washer 19 made in accordance with this invention and comprising the second part of the mold assembly is shown. The washer 19 is one of a plurality of washers, each of which is designed to fit into a recess 11 in the tray 10. The washer 19 can be made of graphite or steel, for example, and it is also substantially rectangular shaped in form. The washer is adapted with an elongated end section 20 which is also rectangular in form and fits into the channel 13. Thus, when the washer is placed into a recess 11, the washer has only one degree of freedom, that is, in a vertical direction. This feature protects the transistor components from vibrations during the fusing process which might otherwise disturb their critical alignment. It should be noted that a small cavity 21, as may be seen in Figs. 3, 4 and 6, has been cut in the bottom side of the washer to provide clearance for the base tab 16. Thus, the elongated section 20 and the cavity 21 prevent the base tab 16 from moving during this process, and the transistor components within each of the recesses and channels are held in place when the tray is handled and passed through the fusing oven.

Each washer is also adapted to hold an emitter material 22, such as a small bead or cylinder of indium, as shown in Fig. 6. Therefore, the washers are provided with a tapered hole 23 extending through the vertical axis of the major portion thereof. By referring now to Fig. 6, it can be understood that once each of the recesses 11 of the tray 10 is properly filled with a collector material 14, a semiconductor crystal chip 15 and a base tab 16 and these components are properly aligned, a washer 19 having an emitter material 22 therein can be placed into each recess to properly align the transistor components preparatory to fusing them. It may be seen with reference to Fig. 6 that the emitter material 22 and the collector material 14 are directly opposed to each other on opposite faces of the crystal chip 15 in accordance with principles of transistor assembly well known in the art.

The tray 10 can now be placed in a suitable oven for a predetermined period of time and heated to a temperature above the melting point of indium and above that of the lead-tin solder, but below the melting point of germanium. In this particular embodiment, an oven temperature of about 600 degrees C. would be satisfactory to accomplish the fusing process. The cylinder of p-type indium 14 will melt, tend to assume a special shape, wet the n-type germanium chip 15, and begin to diffuse into the chip. On the opposite side of the chip, the indium bead 22 will melt and diffuse into the upper face of the chip. Likewise, the solder on the pre-tinned base tab 16 will melt and the tab will be joined to an end section of the chip. After the predetermined fusing time has elapsed, this time being dependent upon the diffusion rates of the collector and emitter materials, the junction width desired, size of the chip utilized, and other well-known transistor characteristics, the tray is removed from the oven and cooled. The transistor assembly, which is of the type shown in Fig. 7, can then be removed by utilizing the vertical slots 17 and 18 in cooperation with a pair of small tweezers as previously mentioned. In this particular embodiment of the invention, these assemblies are comprised of an n-type single crystal germanium chip 15, a p-type collector 14, a p-type emitter 22, and a nickel base tab 16 connected to an end section of the chip. Thus, the p-n-p type diffused junction transistor shown in Fig. 7 can be formed by a process in which all the basic components are simultaneously fused by utilizing the mold assembly described above.

However, it should be understood that this invention is not limited to the particular details described above, as many equivalents will suggest themselves to those skilled in the art. For example, the collector and emitter materials 14 and 22 can be varied as desired, as may the type of semiconductor material used, to form n-p-n type transistors. The semiconductor material could be silicon as well as germanium. Furthermore, the number of recesses 11 drilled in a single tray may be decreased or increased as desired. Likewise, though graphite trays and washers have been found to be quite successful for the purposes of this invention, other materials which will not interfere with the fusing process can be used as well. Therefore, it is desired that the appended claims be given a broad interpretation commensurate with the scope of the invention within the art.

What is claimed is:

1. A mold assembly for forming diffused junction-type transistors comprising a tray having a plurality of recesses therein, each of said recesses comprising a chamber adapted to hold a semiconductor member of a first electrical conductivity type, and an elongated channel communicating with said chamber at a point above the level of said chamber floor and adapted to support a base tab on an end section of said semiconductor member, a plurality of cavities each adapted to hold a first body of material of a second electrical conductivity type adjacent to one face of said semiconductor member, one of each of said cavities being positioned in the floor of each of said chambers within the confines of the outside edges of each of said floors, a plurality of washers, one of each of which is adapted to snugly fit into and rest in one of each of said chambers and its respective communicating channel to hold said base tab and said semiconductor member in an immobile position, said washers each having a hole therethrough adapted to receive and position a second body of material of said second electrical conductivity type adjacent to a second face of said semiconductor member and substantially opposed to said first body of material, whereby said assembly may be utilized to simultaneously fuse said base tab and said second electrical conductivity type bodies to said semiconductor member.

2. A mold assembly for forming diffused junction-type transistors comprising a tray having a plurality of recesses therein, each of said recesses comprising a chamber adapted to hold a semiconductor member of a first electrical conductivity type, and an elongated channel communicating with said chamber at a point above the level of said chamber floor and adapted to support a base tab on an end section of said semiconductor member, a plurality of cavities each adapted to hold a first body of material of a second electrical conductivity type adjacent to one face of said semiconductor member, one of each of said cavities being positioned in the floor of each of said chambers within the confines of the outside edges of each of said floors, a plurality of substantially rectangular-shaped washers, one of each of which is adapted to snugly fit into and rest in one of each of said chambers and its respective communicating channel to hold said semiconductor member and said base tab in an immobile position, said washers each being adapted to move only in an upward vertical direction when positioned within said chambers and said channels, said washers each having a hole therethrough adapted to receive and position a second body of material of said second electrical conductivity type adjacent to a second face of said semiconductor member and substantially opposed to said first body of material, whereby said assembly may be utilized to simultaneously fuse said base tab and said second electrical conductivity type bodies to said semiconductor member.

3. A mold assembly for forming diffused junction-type transistors comprising a tray having a plurality of recesses therein, each of said recesses comprising a chamber adapted to hold a semiconductor member of a first electrical conductivity type, and an elongated step-like channel communicating with said chamber at a point above the level of the floor of said chamber, said channel being adapted to position and support an end of a base tab on an upper step of said channel and an opposite end of said tab on an end section of said semiconductor member, a plurality of cavities each adapted to hold a collector material of a second type electrical conductivity adjacent to one face of said semiconductor member, one of each of said cavities being positioned in the floor of one of each of said chambers within the confines of the outside edges of said floors, a plurality of washers, one of each of which is adapted to snugly fit into and rest in one of each of said chambers and its respective communicating channel to hold said base tab and said semiconductor member in an immobile position, said washers each having a hole therethrough adapted to receive and position an emitter material of said second electrical conductivity type adjacent to a second face of said semiconductor member and substantially opposed to said first body of material, whereby said assembly may be utilized to simultaneously fuse said base tab and said second electrical conductivity type materials to said semiconductor member.

4. A mold assembly for forming diffused junction-type transistors comprising a tray having a plurality of recesses therein, each of said recesses comprising a chamber adapted to hold a semiconductor member of a first electrical conductivity type, and an elongated channel communicating with said chamber at a point above the level of the floor of said chamber, said channel having a step-like portion at the end adjacent to said chamber and a raised portion at the end removed from said chamber to support a base tab partly on an end section of said semiconductor member and partly on said raised portion, said chamber having a pair of vertical slots oppositely disposed along the longitudinal sides thereof and cooperating with said step-like portion to facilitate removal of the components in said tray after fusion, a plurality of cavities each adapted to hold a collector material of a second type electrical conductivity adjacent to one face of said semiconductor member, one of each of said cavities being positioned in the floor of one of each of said chambers within the confines of the outside edges of said floors, a plurality of washers, one of each of which is adapted to snugly fit into and rest in one of each of said chambers and its respective communicating channel to hold said base tab and said semiconductor member in an immobile position, said washers each having a hole therethrough adapted to receive and position an emitter material of said second electrical conductivity type adjacent to a second face of said semiconductor member and substantially opposed to said first body of material, whereby said assembly may be utilized to simultaneously fuse said base tab and said second electrical conductivity type materials to said semiconductor member.

References Cited in the file of this patent

UNITED STATES PATENTS

| | | |
|---|---|---|
| 2,436,597 | Otis | Feb. 24, 1948 |
| 2,456,162 | Waterbury | Dec. 14, 1948 |
| 2,471,258 | Bolten | May 24, 1949 |
| 2,500,546 | Judisch | Mar. 14, 1950 |
| 2,607,957 | Danielson et al. | Aug. 26, 1952 |
| 2,652,592 | Williams | Sept. 22, 1953 |

OTHER REFERENCES

"Production Techniques in Transistor Manufacture," Fahnestock, in Electronics, October 1953, pages 132 and 134 relied on. (Copy in Scientific Lib. and Div. 3, Class 148—1.5.)